(12) United States Patent
Wiseman et al.

(10) Patent No.: US 7,163,862 B1
(45) Date of Patent: Jan. 16, 2007

(54) SEMICONDUCTOR MEMORY DEVICES AND METHODS FOR FABRICATING THE SAME

(75) Inventors: Joseph William Wiseman, Austin, TX (US); Robert Dawson, Austin, TX (US); Kelley Kyle Higgins, Sr., Austin, TX (US); Shengnian Song, Austin, TX (US)

(73) Assignee: Spansion, LLC, Sunnyvale, CA (US)

( * ) Notice: Subject to any disclaimer, the term of this patent is extended or adjusted under 35 U.S.C. 154(b) by 0 days.

(21) Appl. No.: 11/243,752

(22) Filed: Oct. 4, 2005

(51) Int. Cl.
*H01L 21/8247* (2006.01)
(52) U.S. Cl. .............................. 438/257; 257/E21.209
(58) Field of Classification Search ........ 438/257–267; 257/E21.209
See application file for complete search history.

(56) References Cited

U.S. PATENT DOCUMENTS 7,041,572 B1* 5/2006 Yang et al. .................. 438/424

\* cited by examiner

*Primary Examiner*—Richard A. Booth
(74) *Attorney, Agent, or Firm*—Ingrassia Fisher & Lorenz, P.C.

(57) ABSTRACT

Methods and structures are provided for a dual-bit EEPROM semiconductor device. The dual-bit memory device comprises a semiconductor substrate, a tunnel oxide disposed on the semiconductor substrate and first and second spaced apart floating gates that are disposed on the tunnel oxide. An interlayer dielectric layer contacts the tunnel oxide layer at a position between the first and second spaced apart floating gates and electrically isolates the first and second spaced apart floating gates. A control gate contacts the interlayer dielectric layer between the first and second spaced apart floating gates.

15 Claims, 10 Drawing Sheets

SEMICONDUCTOR MEMORY DEVICES AND METHODS FOR FABRICATING THE SAME

FIELD OF THE INVENTION

The present invention generally relates to semiconductor memory devices, and more particularly relates to an improved dual-bit EEPROM device and methods for fabricating the same.

BACKGROUND OF THE INVENTION

Flash electrically erasable and programmable read-only memories (EEPROM's) are a class of nonvolatile memory devices that are programmed by hot electron injection and erased by Fowler-Nordheim tunneling. FIG. 1 is a cross-sectional view of a conventional flash EEPROM memory cell. The cell 10 is formed on a substrate 12, having a heavily doped drain region 14 and source region 16 embedded therein. The drain and source regions typically contain lightly doped deeply diffused regions 18, 20, respectively, and more heavily doped shallow diffused regions 22, 24, respectively, embedded into the substrate 12. A channel region 26 separates the drain region 14 and source region 16. The cell 10 typically is characterized by a vertical stack of a tunnel oxide layer 28, a floating gate 30 over the tunnel oxide, an interlevel dielectric layer 32, and a control gate 34 over the interlevel dielectric layer.

One important interlevel dielectric material for fabrication of an EEPROM is an oxide-nitride-oxide (ONO) structure. One EEPROM device that utilizes the ONO structure is a floating gate FLASH EEPROM device, in which the ONO structure is formed over the floating gate, typically a polysilicon floating gate.

Generally, a flash memory cell is programmed by inducing hot electron injection from a portion of the substrate, such as the channel section near the drain region, to the floating gate. Electron injection carries negative charge into the floating gate. The injection mechanism can be induced by grounding the source region and a bulk portion of the substrate and applying a relatively high positive voltage to the control gate to create an electron attracting field and applying a positive voltage of moderate magnitude to the drain region in order to generate "hot" (high energy) electrons. After sufficient negative charge accumulates on the floating gate, the negative potential of the floating gate raises the threshold voltage of its field effect transistor (FET) and inhibits current flow through the channel region through a subsequent "read" mode. The magnitude of the read current is used to determine whether or not a flash memory cell is programmed. The act of discharging the floating gate of a flash memory cell is called the erase function. The erase function is typically carried out by a Fowler-Nordheim tunneling mechanism between the floating gate and the source region of the transistor (source erase or negative gate erase) or between the floating gate and the substrate (channel erase). A source erase operation is induced by applying a high positive voltage to the source region and grounding the control gate and the substrate while floating the drain of the respective memory cell.

Non-volatile memory designers have taken advantage of the localized nature of electron storage within the silicon nitride layer of the ONO layer and have designed memory circuits that utilize two regions of stored charge within an ONO layer. This type of non-volatile memory device is known as a dual-bit EEPROM, which is available under the trademark MIRRORBIT™ from Advanced Micro Devices, Inc., Sunnyvale, Calif. A dual-bit EEPROM is capable of storing twice as much information as a conventional EEPROM in a memory array of equal size. A left and right bit is stored in physically different areas of the silicon nitride layer, near left and right regions of each memory cell. Programming methods then are used that enable the two bits to be programmed and read simultaneously. The two bits of the memory cell can be individually erased by applying suitable erase voltages to the gate and to either the source or drain regions.

Generally in the semiconductor industry, there is a continuing trend toward higher device densities. To achieve these high densities there has been and continues to be efforts toward scaling down the device dimensions on semiconductor wafers. To accomplish such high device packing density, smaller and smaller feature sizes are required. This includes the width and spacing of such features. This trend impacts the design and fabrication of non-volatile semiconductor memory devices, including the dual-bit EEPROM. For example, photolithography steps for patterning the floating gate and control gate of a small-scaled dual-bit EEPROM are particularly difficult and may reduce device yield.

Accordingly, it is desirable to provide a non-volatile semiconductor memory device that provides increased storage capacity with small feature size. In addition, it is desirable to provide a method for fabricating a non-volatile semiconductor memory device that provides increased storage capacity with small feature size. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A dual-bit memory device in accordance with an exemplary embodiment of the present invention is provided. The dual-bit memory device comprises a semiconductor substrate, a tunnel oxide disposed on the semiconductor substrate, and first and second spaced apart floating gates that are disposed on the tunnel oxide. An interlayer dielectric layer contacts the tunnel oxide layer at a position between the first and second spaced apart floating gates and electrically isolates the first and second spaced apart floating gates. A control gate contacts the interlayer dielectric layer between the first and second spaced apart floating gates.

A method for fabricating a dual-bit memory device in accordance with an exemplary embodiment of the present invention is provided. The method comprises the steps of providing a semiconductor substrate and forming a tunnel oxide overlying the semiconductor substrate. First and second spaced apart disposable structures, each having a vertical edge, are formed overlying the semiconductor substrate and a portion of the tunnel oxide is exposed. A first floating gate is formed on the vertical edge of the first disposable structure and a spaced apart second floating gate is formed on the vertical edge of the second disposable structure. An interlayer dielectric is formed overlying the first floating gate and the second floating gate. A control gate is formed between the first floating gate and the spaced apart second floating gate and contacting the interlayer dielectric.

A method for fabricating a semiconductor device in accordance with another exemplary embodiment of the present invention also is provided. The method comprises the steps of depositing a first material layer overlying a semiconductor substrate and etching the first material layer to form a first material member and a second material member. Portions of the semiconductor substrate between the first and second material members are exposed and a tunnel oxide layer is formed on the exposed portions of the semiconductor substrate. A first silicon layer is deposited overlying the first and second material members and the tunnel oxide layer and is anisotropically etched to form a first floating gate disposed adjacent a side of the first material member and a second floating gate disposed adjacent a side of the first material member. The first floating gate is discontinuous with the second floating gate. An interlevel dielectric layer is formed overlying the tunnel oxide layer, the first and second floating gates, and the first and second material members and a second silicon layer is deposited overlying the interlevel dielectric layer. A portion of the second silicon layer and a portion of the interlevel dielectric layer are removed to expose the first and second material members and the first and second material members are anisotropically etched. A first metal silicide contact is formed on the second silicon layer.

BRIEF DESCRIPTION OF THE DRAWINGS

The present invention will hereinafter be described in conjunction with the following drawing figures, wherein like numerals denote like elements, and wherein

FIG. 3 is a top view of a memory array formed in accordance with various steps of an exemplary embodiment of the method of the present invention. FIG. 3 illustrates cross-sectional axes 4—4 and 5—5;

FIG. 4 is a cross-sectional view of the memory array of FIG. 3 taken along cross-sectional axis 4—4;

FIG. 5 is a cross-sectional view of the memory array of FIG. 3 taken along cross-sectional axis 5—5;

FIG. 6 is a top view of the memory array of FIG. 3 formed in accordance with additional steps of an exemplary embodiment of the method of the present invention;

FIG. 7 is a cross-sectional view of the memory array of FIG. 6 taken along cross-sectional axis 7—7;

FIG. 8 is a cross-sectional view of the memory array of FIG. 6 taken along cross-sectional axis 8—8;

FIG. 9 is a cross-sectional view of the memory array of FIG. 6 taken along cross-sectional axis 9—9;

FIG. 10 is a cross-sectional view of the memory array of FIG. 7, taken along the same cross-sectional axis as FIG. 7, formed in accordance with further steps of an exemplary embodiment of the method of the present invention;

FIG. 11 is a cross-sectional view of the memory array of FIG. 8, taken along the same cross-sectional axis as FIG. 8, formed in accordance with the steps of FIG. 10;

FIG. 12 is a cross-sectional view of the memory array of FIG. 9, taken along the same cross-sectional axis as FIG. 9, formed in accordance with the steps of FIG. 10;

FIG. 13 is a top view of the memory array of FIGS. 10–12 formed in accordance with additional steps of an exemplary embodiment of the method of the present invention;

FIG. 14 is a cross-sectional view of the memory array of FIG. 13, taken along the cross-sectional axis 14—14;

FIG. 15 is a cross-sectional view of the memory array of FIG. 13, taken along the cross-sectional axis 15—15;

FIG. 16 is a cross-sectional view of the memory array of FIG. 13, taken along the cross-sectional axis 16—16;

FIG. 17 is a top view of the memory array of FIG. 13 formed in accordance with further steps of an exemplary embodiment of the method of the present invention;

FIG. 18 is a cross-sectional view of the memory array of FIG. 17, taken along the cross-sectional axis 18—18, formed in accordance with additional steps of an exemplary embodiment of the method of the present invention;

FIG. 19 is a cross-sectional view of the memory array of FIG. 17, taken along the cross-sectional axis 19—19, formed in accordance with the steps of FIG. 18;

FIG. 20 is a cross-sectional view of the memory array of FIG. 17, taken along the cross-sectional axis 20—20, formed in accordance with the steps of FIG. 18;

FIG. 21 is a cross-sectional view of the memory array of FIG. 18, taken along the same cross-sectional axis as FIG. 18, formed in accordance with further steps of an exemplary embodiment of the method of the present invention;

FIG. 22 is a cross-sectional view of the memory array of FIG. 19, taken along the same cross-sectional axis as FIG. 19, formed in accordance with the steps of FIG. 21;

FIG. 23 is a cross-sectional view of the memory array of FIG. 20, taken along the same cross-sectional axis as FIG. 20, formed in accordance with the steps of FIG. 21;

FIG. 24 is a cross-sectional view of the memory array of FIG. 21, taken along the same cross-sectional axis as FIG. 21, formed in accordance with additional steps of an exemplary embodiment of the method of the present invention;

FIG. 25 is a cross-sectional view of the memory array of FIG. 22, taken along the same cross-sectional axis as FIG. 22, formed in accordance with the steps of FIG. 24;

FIG. 26 is a cross-sectional view of the memory array of FIG. 23, taken along the same cross-sectional axis as FIG. 23, formed in accordance with the steps of FIG. 24;

FIG. 27 is a cross-sectional view of the memory array of FIG. 24, taken along the same cross-sectional axis as FIG. 24, formed in accordance with further steps of an exemplary embodiment of the method of the present invention;

FIG. 28 is a cross-sectional view of the memory array of FIG. 25, taken along the same cross-sectional axis as FIG. 25, formed in accordance with the steps of FIG. 27; and FIG. 29 is a cross-sectional view of the memory array of FIG. 26, taken along the same cross-sectional axis as FIG. 26, formed in accordance with the steps of FIG. 27.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
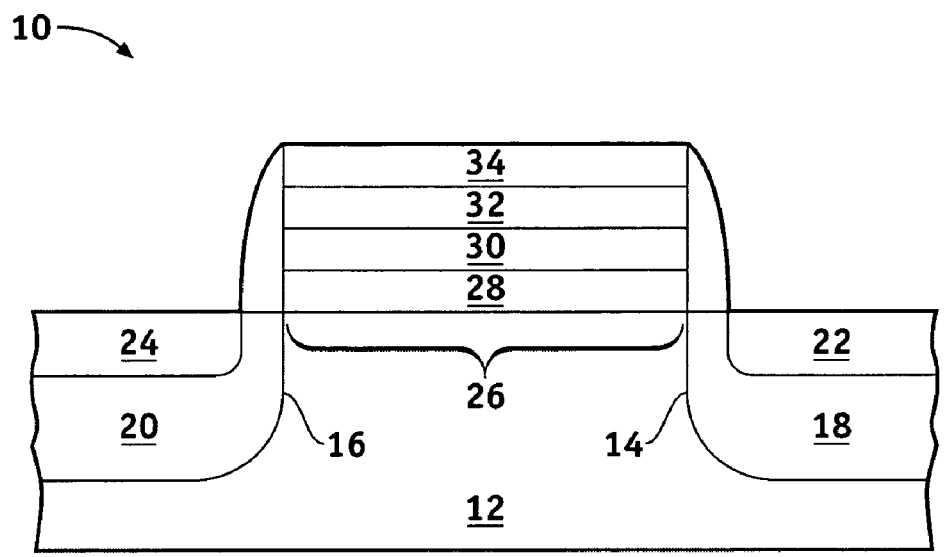
FIG. 1 is a cross-sectional view of a conventional flash EEPROM memory device with a floating gate.
Figure 2:
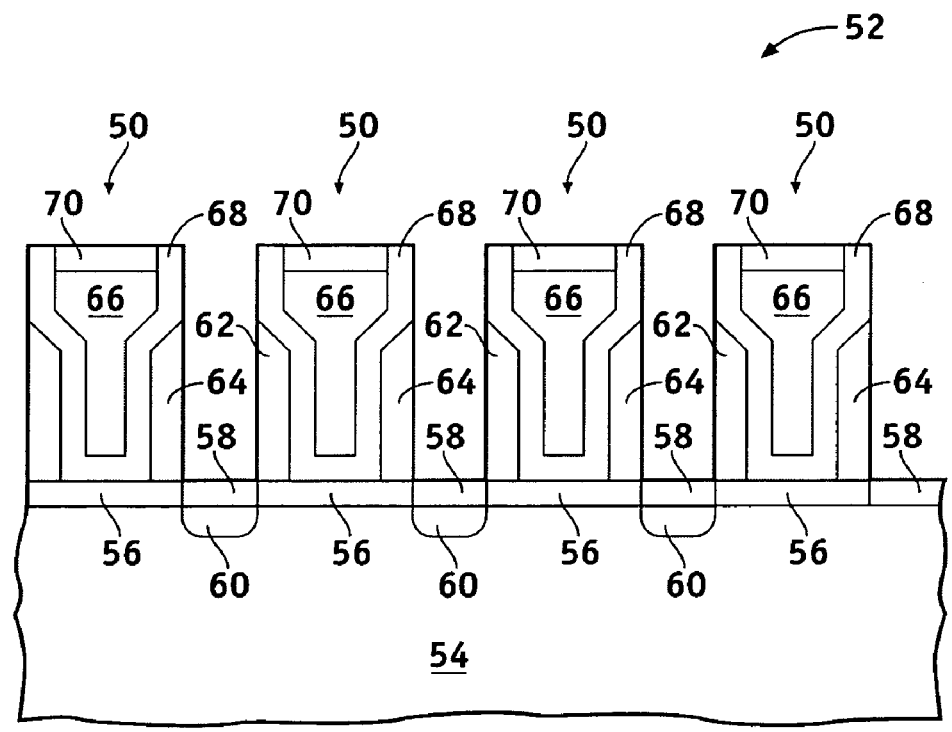
FIG. 2 is a cross-sectional view of a dual-bit floating gate EEPROM memory device, in accordance with an exemplary embodiment of the present invention.

FIG. 2 illustrates schematically, in cross section, a dual-bit floating gate non-volatile memory device 50 in accordance with an exemplary embodiment of the present invention. While four memory devices 50 are illustrated in FIG. 2 forming a memory array 52, it will be appreciated that any suitable number of memory devices 50 may comprise memory array 52. Each memory device 50 is disposed on tunnel oxide layer 56 that is formed on a silicon substrate 54.

Each memory device 50 comprises two polysilicon floating gates 62, 64 disposed on tunnel oxide layer 56 and physically separated from one another. An interlevel dielectric layer 68 is disposed about a portion of each floating gate 62, 64 and is in physical contact with the tunnel oxide layer 56 between the floating gates. The interlevel dielectric layer 68 may comprise an ONO layer, that is, a silicon nitride layer interposed between two silicon oxide layers. A polysilicon control gate 66 is disposed overlying interlevel dielectric layer 68 and is capped with a second metal silicide contact 70. The control gate 66 is electrically isolated from the floating gates 62 and 64 by the interlevel dielectric layer 68. In addition, the tunnel oxide layer 56 and the overlying interlevel dielectric layer 68 are sufficiently thick so that a threshold voltage exists between the control gate 66 and the substrate 54 to prevent leakage during functioning of the device. In an exemplary embodiment of the invention, a first metal silicide contact 58 may be disposed on substrate 54 between each tunnel oxide layer. A drain region 60 may be formed within substrate 54 in self-alignment with the memory devices 50.

Accordingly, as illustrated in FIG. 2, memory device 50 comprises a dual bit architecture that allows twice as much storage capacity as a conventional EEPROM stacked gate memory device. In addition, with a substantially vertical floating gate, the memory device can be made with smaller features without significantly reducing the surface area of the floating gate and thus adversely affecting programming of the device.

FIGS. 3–29 illustrate method steps for manufacturing a semiconductor device, such as dual-bit floating gate non-volatile memory devices 50 of a memory array 90, in accordance with an exemplary embodiment of the present invention. FIGS. 3–29 illustrate various top views and cross-sectional views of memory array 90 and memory devices 50. Various steps in the manufacture of memory devices 50 are well known and so, in the interest of brevity, many conventional steps will only be mentioned briefly herein or will be omitted entirely without providing the well known process details.

Figure 3:
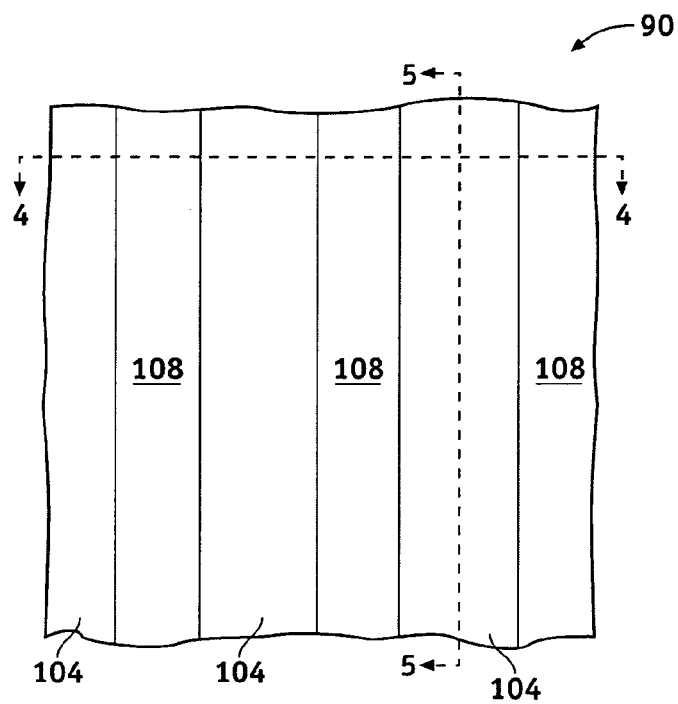
FIGS. 3–29 illustrate, in cross section, method steps for manufacturing a dual-bit floating gate EEPROM memory device in accordance with an exemplary embodiment of the present invention. In particular.
Figure 4:
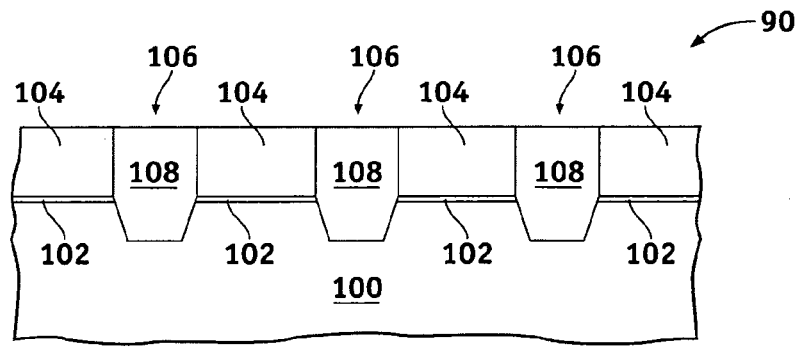
Figure 5:
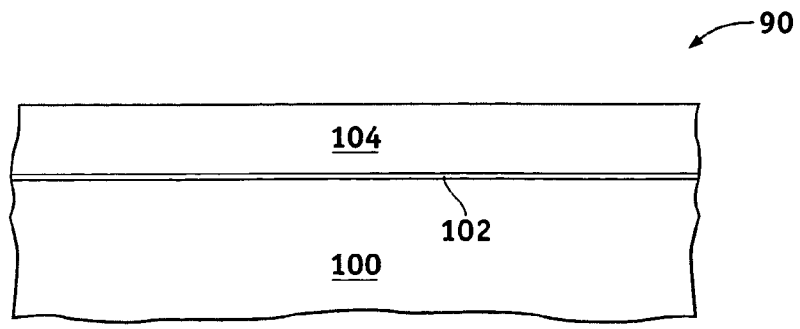

As illustrated in FIGS. 3–5, the manufacture of memory devices 50 begins by oxidizing a silicon substrate 100 to form a thin pad oxide 102 having any suitable thickness. In an exemplary embodiment, the pad oxide has a thickness of about 5–20 nm, preferably about 10–12 nm. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly the substrate. Silicon substrate 100 may be a bulk silicon wafer or a thin layer of silicon on an insulating layer (commonly known as a silicon-on-insulator wafer or SOI wafer) that, in turn, is supported by a silicon carrier wafer. The pad oxide 102 can be grown by heating the silicon substrate in an oxygen ambient or by depositing silicon oxide on the silicon substrate.

A silicon nitride layer 104 is deposited on the pad oxide 102. The silicon nitride layer 104 can be deposited, for example, by low pressure chemical vapor deposition (LPCVD) or plasma enhanced chemical vapor deposition (PECVD) from the reaction of trichlorosilane or dichlorosilane and ammonia. As illustrated in more detail below, by controlling the thickness of the silicon nitride, floating gate structures can be formed that have sufficient areas allowing for programming of subsequently-formed dual-bit memory devices. In one embodiment of the present invention, the silicon nitride layer 104 has a thickness in the range of about 200 nm to about 300 nm.

A layer of photoresist (not shown) is applied to the surface of silicon nitride layer 104 and is photolithographically patterned to serve as an etch mask. Silicon nitride layer 104, pad oxide layer 102, and silicon substrate 100 then are etched to form a plurality of trenches 106 that extend into silicon substrate 100. The trenches can be etched using any suitable etch chemistry conventionally used to form shallow trench isolation (STI). The photoresist layer is removed after completing the etching of trenches 106. Alternatively, the patterned photoresist layer can be removed after being used as an etch mask for the etching of silicon nitride 104. The etched layer of silicon nitride then can be used as a hard mask to mask the etching of silicon substrate 100. The trenches 106 are filled with deposited oxide or other insulator 108, for example, by LPCVD or PECVD. Deposited insulator 108 fills trenches 106, but is also deposited onto silicon nitride layer 104. The excess insulator on silicon nitride layer 104 is polished back using CMP to complete the formation of STI, as illustrated in FIGS. 3–5.

Figure 6:
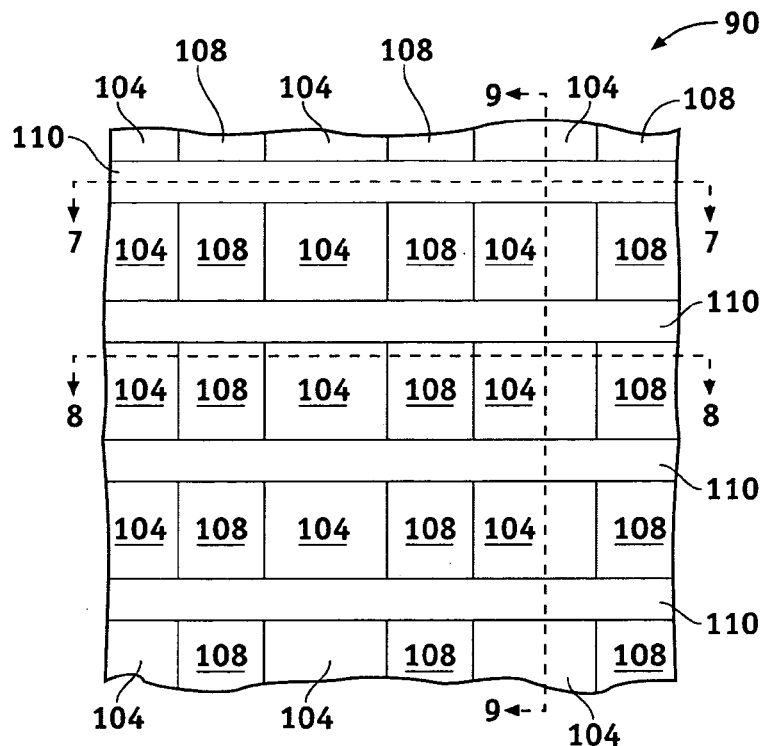
Figure 7:
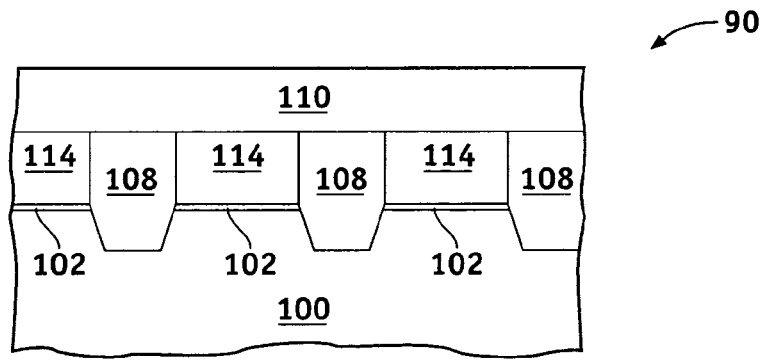
Figure 8:
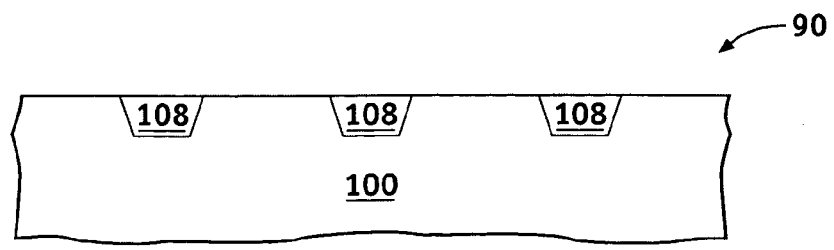
Figure 9:
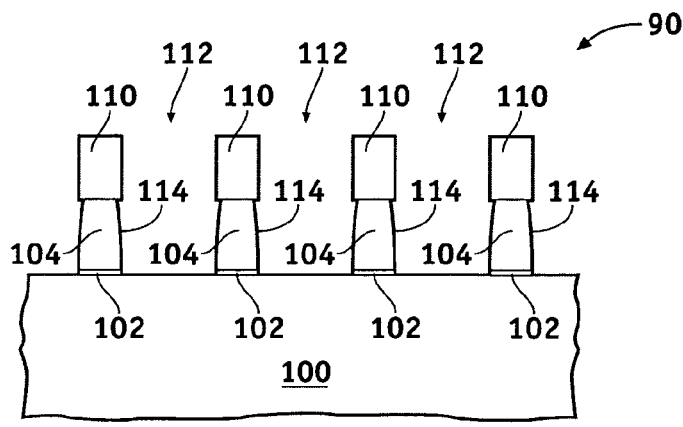

Referring to FIGS. 6–9, a second layer of photoresist 110 is applied to the surface of array 90 and is photolithographically patterned as illustrated in FIG. 6. Photoresist layer 110 is applied in a pattern that is perpendicular to the STI photoresist pattern illustrated in FIGS. 3–5. Patterned photoresist 110 is used as an etch mask to etch a plurality of trenches 112 within the remaining portions of silicon nitride layer 104 and the remaining portions of deposited insulator 108, as illustrated in FIGS. 7–9, thus forming silicon nitride members 114. The trenches are anisotropically etched, for example, by reactive ion etching (RIE). After the anisotropic etching, array 90 is subjected to a cleaning process to remove exposed regions of the pad oxide 102, thus exposing portions of silicon substrate 100, as illustrated in FIGS. 8–9. Second photoresist layer 110 then may be removed.

Figure 10:
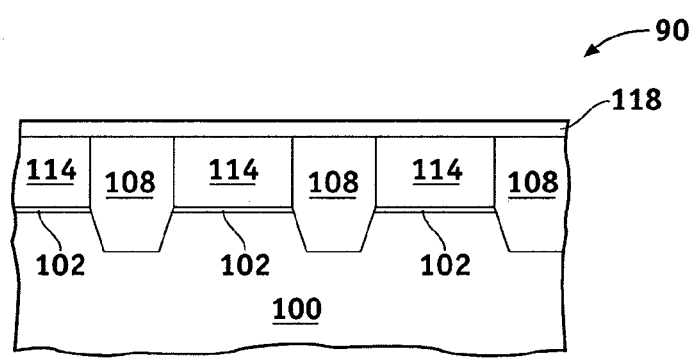
Figure 11:
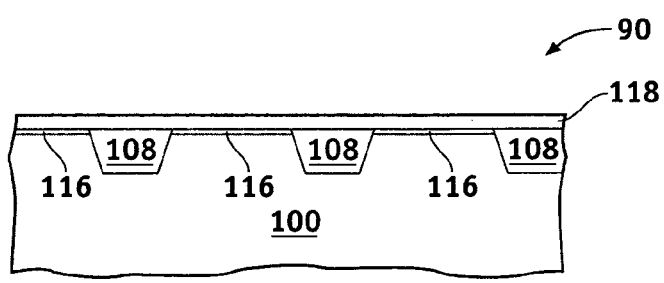
Figure 12:
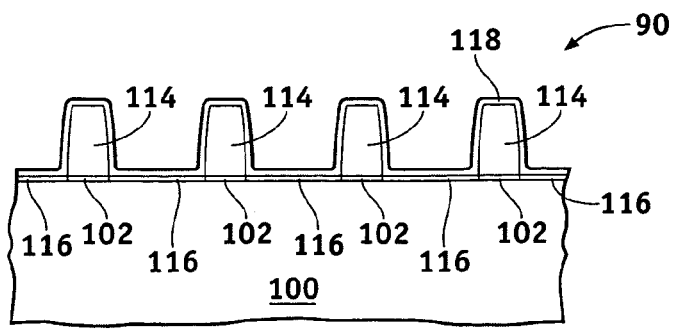
Figure 13:
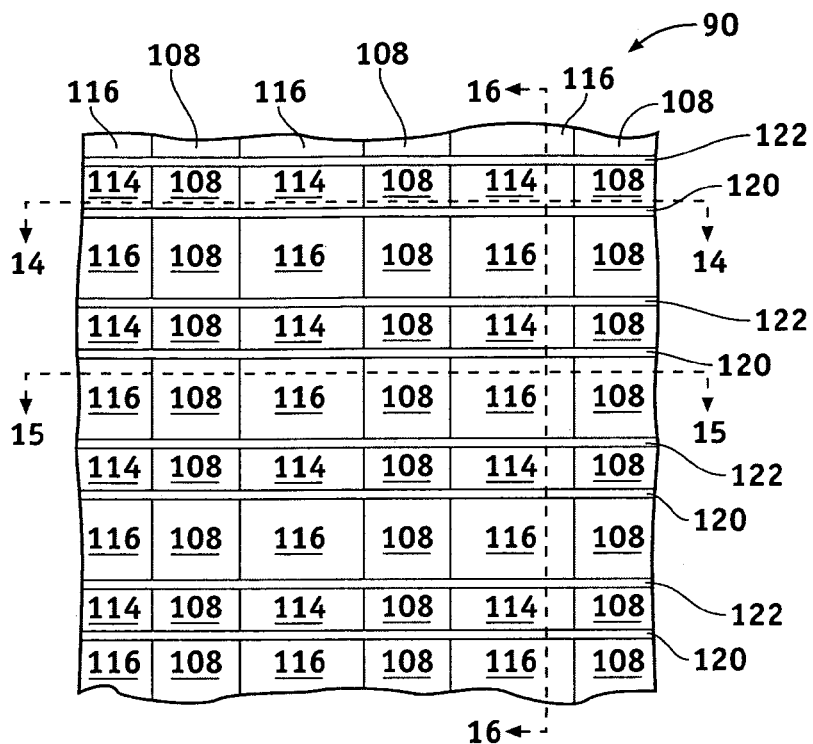
Figure 14:
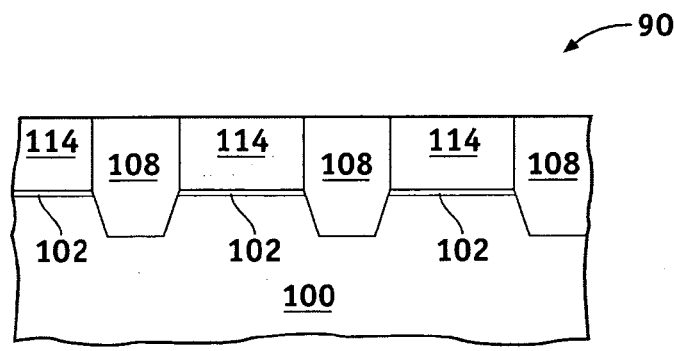
Figure 15:
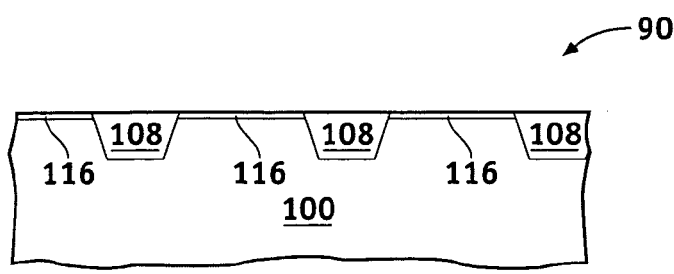
Figure 16:
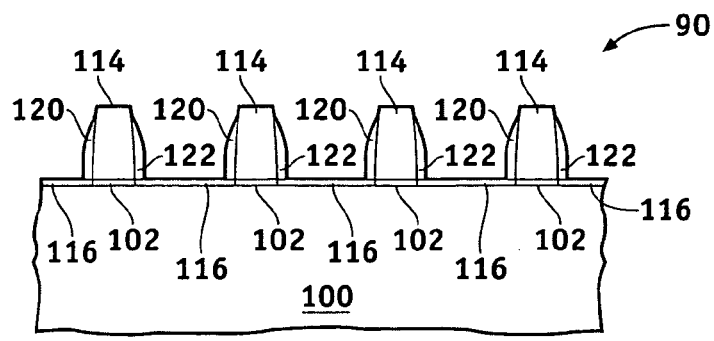

A tunnel oxide layer 116 is formed on the exposed portions of silicon substrate 100, as illustrated in FIGS. 10–12. FIGS. 10–12 illustrate array 90 along the same cross-sectional axes as FIGS. 7–9, respectively. The tunnel oxide layer may be thermally grown silicon dioxide formed by heating the silicon substrate in an oxidizing ambient, or may be a deposited insulator such as a silicon oxide, silicon nitride, silicon oxynitride, a high dielectric constant insulator such as HfSiO, or the like. Deposited insulators can be deposited by chemical vapor deposition (CVD), LPCVD, PECVD, or atomic layer deposition (ALD). A layer 118, preferably of polysilicon, is deposited over array 90 to any suitable thickness. In an exemplary embodiment, layer 118 has a thickness in the range of about 30 nm to about 100 nm. The polysilicon layer 118 then is etched using any conventional anisotropic etch, such as, for example, RIE, as illustrated in FIGS. 13–16. FIGS. 14–16 illustrate array 90 along the same cross-sectional axes as FIGS. 10–12, respectively. The etch of the polysilicon layer 118 results in the formation of a first spacer 120 and a second spacer 122 disposed on opposite surfaces of each silicon nitride member 114, as illustrated in FIGS. 13 and 16. The etch is of sufficient time and suitable chemistry so that first spacer 120 and second spacer 122 are physically isolated from each other and are recessed below a top surface of silicon nitride member 114.

Figure 17:
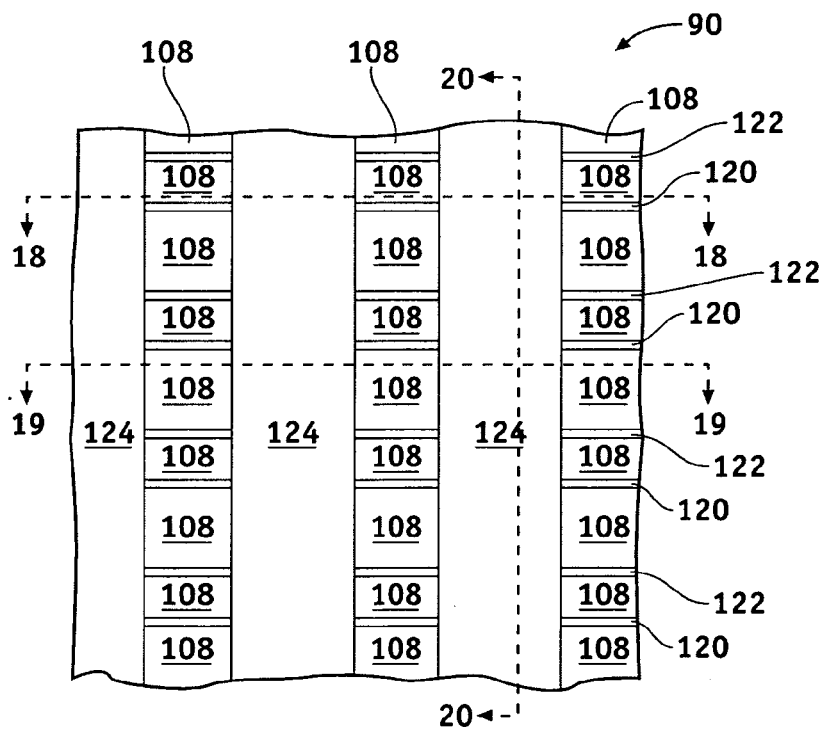
Figure 18:
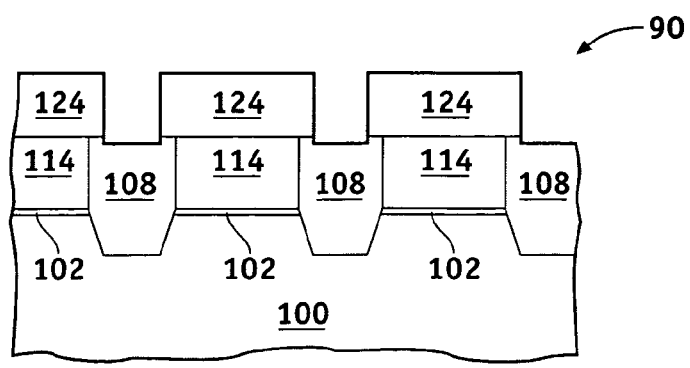
Figure 19:
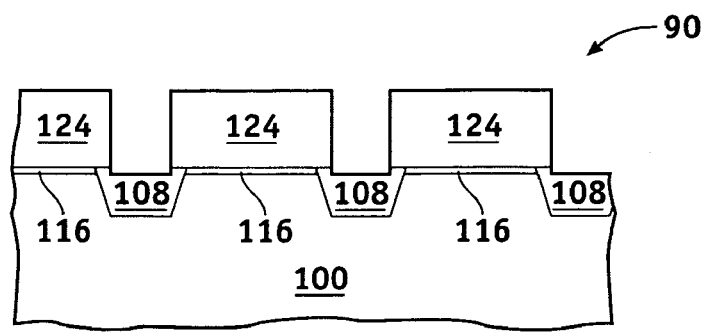
Figure 20:
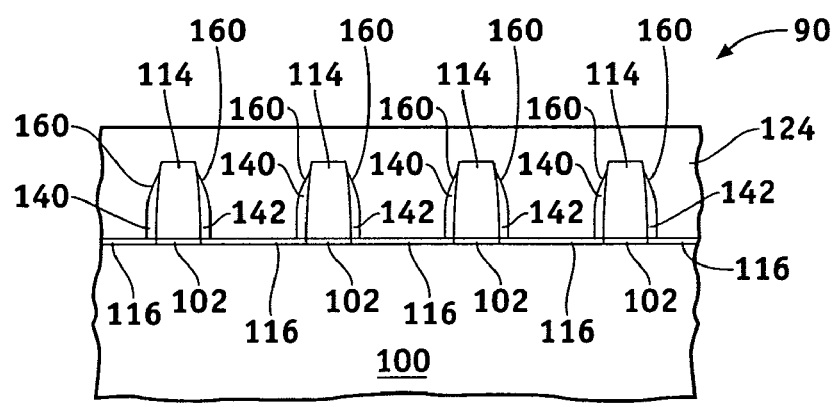

A third layer of photoresist 124 is applied to the surface of array 90 and is photolithographically patterned as illustrated in FIG. 17. Patterned photoresist 124 is used as an etch mask for an anisotropic etch to etch portions of first spacer 120 and second spacer 122, thus isolating adjacent memory devices from each other. As illustrated in FIGS. 18–20, although the anisotropic etch chemistry preferably is selective to deposited insulator 108, the anisotropic etch may result in some loss of the exposed surfaces of deposited insulator 108. Upon etching, the remaining portions of first spacer 120 and second spacer 122 form first floating gates 140 and second floating gates 142, respectively. As illustrated in FIG. 20, first and second floating gates 140 and 142 are substantially vertical, that is, each of the first and second floating gates has a surface 160 that extends substantially perpendicular to a surface of silicon substrate 100 and has sufficient surface area that the floating gates can be readily programmed. The third layer of photoresist then is removed.

Figure 21:
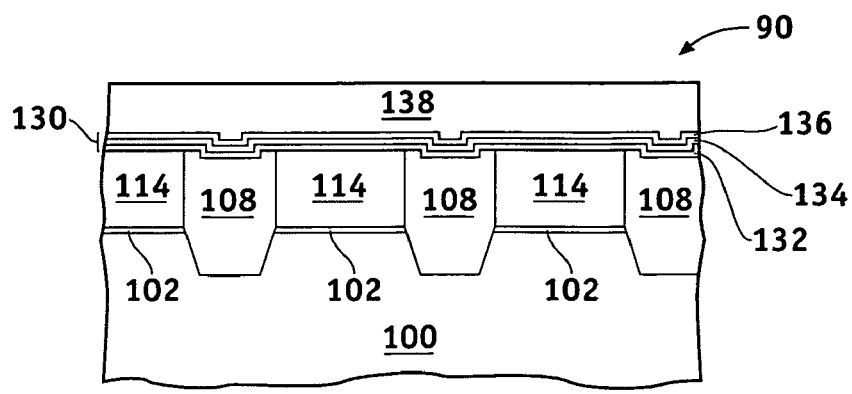
Figure 22:
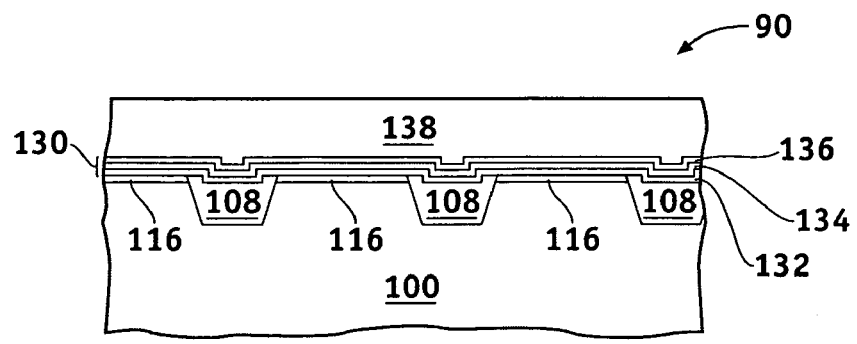
Figure 23:
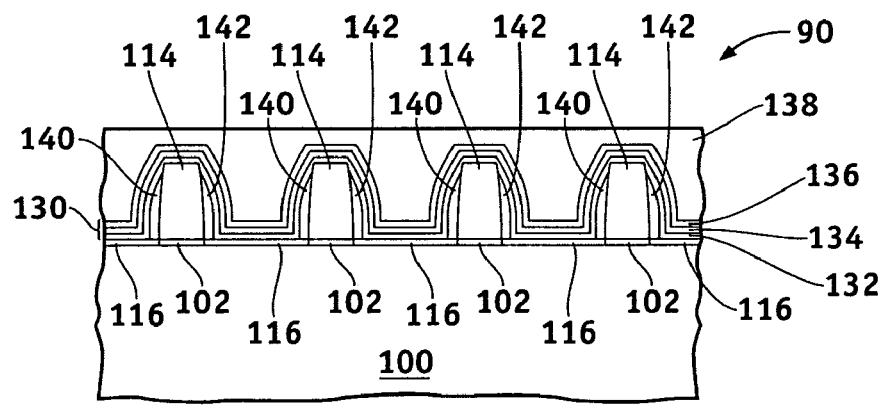

An interlevel dielectric layer 130 is deposited over array 90, as illustrated in FIGS. 21–23. FIGS. 21–23 illustrate array 90 along the same cross-sectional axes as FIGS. 18–20, respectively. Interlevel dielectric layer 130 may include a first oxide layer 132, a charge storage layer 134 overlying the first oxide layer, and a second oxide layer 136 overlying the charge storage layer. The first oxide layer 132 may be deposited onto array 90 to a thickness in the range of about 1 nm to about 5 nm. In one embodiment of the present invention, the charge storage layer 134 is a silicon nitride layer having a thickness in the range of about 7 nm to about 9 nm. In other embodiments, the charge storage layer comprises other known dielectric charge storage materials, such as, for example, high K dielectric materials, of suitable thickness. The second oxide layer 136, with a thickness in the range of about 1 nm to about 3 nm, can be deposited or can be grown from the charge storage layer 134 by heating the charge storage layer in an oxygen ambient.

Figure 24:
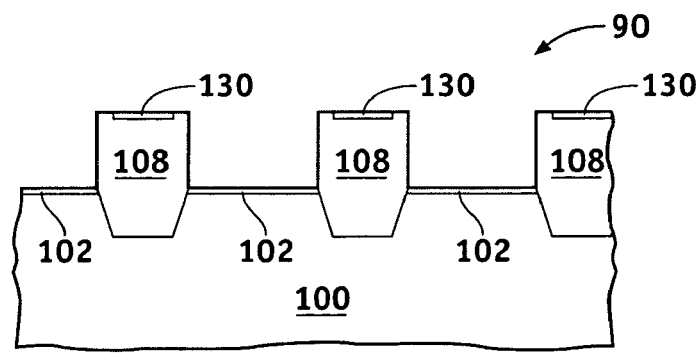
Figure 25:
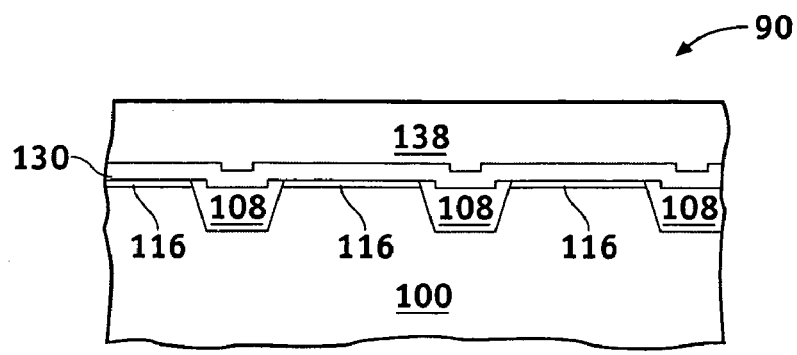
Figure 26:
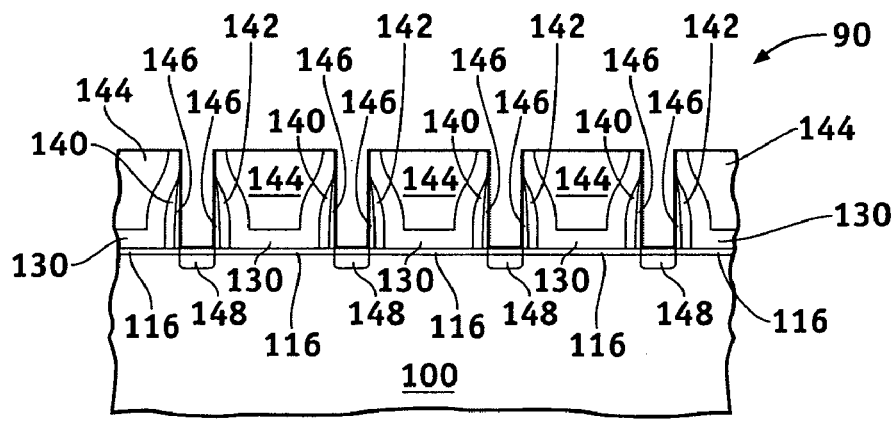

A layer 138, preferably of polysilicon, is globally deposited over array 90, as illustrated in FIGS. 21–23. Layer 138 is deposited to a sufficient thickness so that, after a subsequent CMP process discussed in more detail below, silicon nitride members 114 are exposed, array 90 has a substantially planar surface, and a sufficient thickness of interlevel dielectric layer 130 remains to preserve the electrical isolation of first floating gates 140 and second floating gates 142 from layer 138. After deposition of layer 138, portions of layer 138 and portions of dielectric interlevel layer 130 are removed by CMP, mentioned above, to planarize the surface of array 90, expose silicon nitride members 114, and form control gates 144, as illustrated in FIGS. 24–26. FIGS. 24–26 illustrate array 90 along the same cross-sectional axes as FIGS. 21–23, respectively. It will be appreciated that the tunnel oxide 116 and overlying interlevel dielectric layer 130 should each be deposited so that together the layers are of sufficient thickness that short circuits between control gates 144 and substrate 100 are prevented.

The silicon nitride members 114 then are removed using any suitable conventional dry etch that will etch silicon nitride while leaving polysilicon floating gates 140 and 142 and polysilicon control gates 144 substantially intact. In one embodiment of the invention, the silicon nitride members 114 may be substantially removed while leaving nitride spacers 146 disposed adjacent polysilicon floating gates 140 and 142. In another embodiment of the invention, after removal of silicon nitride members 114, a dielectric material, such as a silicon oxide, may be deposited overlying array 90 and anisotropically etched to form spacers adjacent to floating gates 140 and 142. The spacers will prevent formation of metal silicide onto the exposed surfaces of the floating gates 140 and 142 from a subsequent silicide process discussed in more detail below. After removal of silicon nitride members 114, control gates 144, interlevel dielectric layer 130, floating gates 140 and 142 and spacers 146, if present, can be used as an ion implantation mask to form source regions (not shown) and drain regions 148 in silicon substrate 100 using any conventionally known processes.

Figure 27:
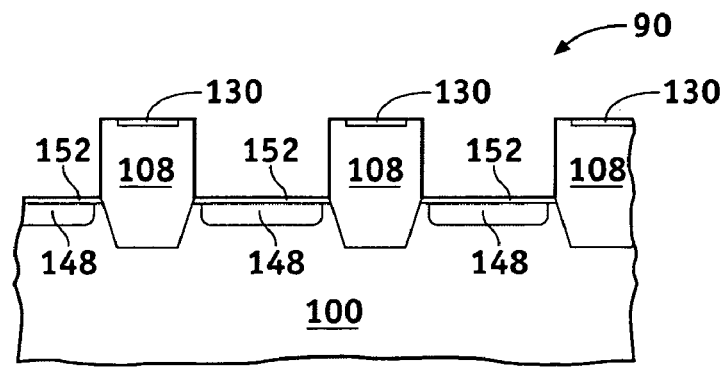
Figure 28:
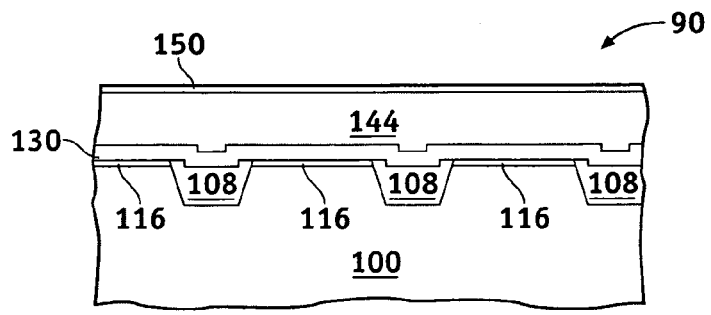
Figure 29:
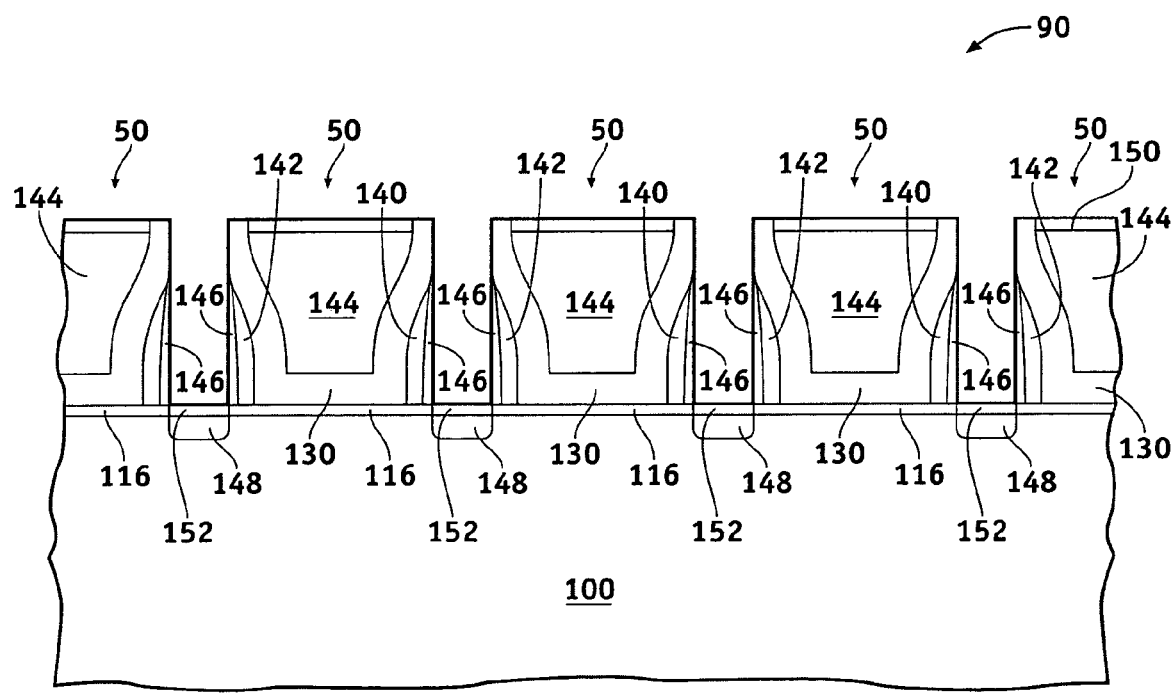

Referring to FIGS. 27–29, a layer of silicide forming metal is deposited onto array 90 and is heated, for example, by rapid thermal annealing (RTA), to form first metal silicide contacts 150 on control gates 144 and second metal silicide contacts 152 on drain regions 148. FIGS. 27–29 illustrate array 90 along the same cross-sectional axes as FIGS. 24–26, respectively. The silicide forming metal can be, for example, cobalt, nickel, rhenium, ruthenium, or palladium, and preferably is cobalt or nickel or nickel plus about 5% platinum. The silicide forming metal can be deposited, for example, by sputtering to a thickness of about 30–50 nm. Any silicide forming metal that is not in contact with exposed silicon, for example, the silicide forming metal that is deposited on spacers 146, does not react during the RTA to form a silicide and subsequently may be removed by wet etching in an $NH_4OH/H_2O_2$, $H_2O_2/H_2SO_4$, or $HNO_3/HCl$ solution.

Accordingly, as illustrated in FIG. 29, an array of dual-bit floating gate non-volatile memory devices 50 are formed. Each dual-bit floating gate memory device 50 comprises a tunnel oxide 116 disposed overlying a silicon substrate 100, floating gates 140 and 142, an interlevel dielectric layer 130, preferably an O—N—O layer, a control gate 144 that is electrically isolated from the floating gates 140, 142 by interlevel dielectric 130, and a metal contact 150 disposed on the control gate. Because the floating gates and control gates of the memory device are formed by damascene techniques, difficult photolithography steps to form the gates are eliminated, thus improving device yield. In addition, the damascene techniques permit the formation of a dual-bit floating gate memory device with features sizes that can be made smaller than the features sizes of conventional floating gate memory devices, resulting in increased information storage capacity with increased device density.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a dual-bit memory device comprising the steps of:

providing a semiconductor substrate;

forming a tunnel oxide overlying said semiconductor substrate;

forming first and second spaced apart disposable structures overlying said semiconductor substrate and exposing a portion of said tunnel oxide, each of said first and second disposable structures having a vertical edge;

forming a first floating gate on said vertical edge of said first disposable structure and a spaced apart second floating gate on said vertical edge of said second disposable structure;

forming an interlayer dielectric overlying said first floating gate and said second floating gate;

forming a control gate between said first floating gate and said spaced apart second floating gate and contacting said interlayer dielectric; and removing the first and second spaced apart disposable spacers.

2. The method of claim 1, wherein the step of forming an interlayer dielectric overlying said first floating gate and said second floating gate comprises forming said interlayer dielectric in contact with said tunnel oxide.

3. The method of claim 1, wherein the step of forming an interlayer dielectric comprises the steps of:

forming a first silicon oxide layer overlying said first floating gate and said second floating gate;

depositing a silicon nitride layer overlying said first silicon oxide layer; and depositing a second silicon oxide layer overlying said silicon nitride layer.

4. The method of claim 1, wherein the step of forming said first and second spaced apart disposable structures comprises the step of forming first and second spaced apart silicon nitride structures.

5. The method of claim 1, further comprising the steps of:

forming an impurity-doped region in said semiconductor substrate; and forming an electrical contact on said impurity-doped region.

6. The method of claim 1, wherein the step of forming said first and second floating gates comprises the step of forming substantially vertical first and second floating gates.

7. The method of claim 1, wherein the step of removing said first and second spaced apart disposable spacers comprises the step of etching said first and second spaced apart disposable spacers using reactive ion etching.

8. The method of claim 1, wherein, after the step of removing said first and second spaced apart disposable spacers, a spacer is formed on said first and second floating gates.

9. A method for fabricating a semiconductor device, the method comprising the steps of:

depositing a first material layer overlying a semiconductor substrate;

etching said first material layer to form a first material member and a second material member;

exposing portions of said semiconductor substrate between said first and second material members;

forming a tunnel oxide layer on said exposed portions of said semiconductor substrate;

depositing a first silicon layer overlying said first and second material members and said tunnel oxide layer;

anisotropically etching said first silicon layer to form a first floating gate disposed adjacent a side of said first material member and a second floating gate disposed adjacent a side of said second material member, said first floating gate discontinuous with said second floating gate;

forming an interlevel dielectric layer overlying said tunnel oxide layer, said first and second floating gates, and said first and second material members;

depositing a second silicon layer overlying said interlevel dielectric layer;

removing a portion of said second silicon layer and a portion of said interlevel dielectric layer to expose said first and second material members;

anisotropically etching said first and second material members, and forming a first metal silicide contact on said second silicon layer.

10. The method of claim 9, further comprising the steps of:

forming an impurity-doped region in said semiconductor substrate in self alignment with said first floating gate; and forming a second metal silicide contact on said impurity-doped region.

11. The method of claim 9, wherein the step of depositing a first material layer overlying said semiconductor substrate comprises the step of depositing a silicon nitride layer overlying said semiconductor substrate.

12. The method of claim 9, wherein the step of forming an interlevel dielectric layer comprises the steps of:

forming a first silicon oxide layer overlying said tunnel oxide layer, said first and second floating gates, and said first and second material members;

depositing a silicon nitride layer on said first silicon oxide layer; and forming a second silicon oxide layer overlying said silicon nitride layer.

13. The method of claim 9, wherein, before the step of etching said first material layer to form first and second material members, the method further comprises the steps of:

etching a trench that extends through said first material layer and into said semiconductor substrate; and depositing an insulating dielectric material in said trench.

14. The method of claim 13, wherein, before the step of etching a trench, the method comprises the steps of:

depositing a first photoresist mask on said first material layer; and removing a portion of said first photoresist mask according to a first pattern.

15. The method of claim 14, wherein, before the step of etching said first material layer to form first and second material members, the method comprises the steps of:

depositing a second photoresist mask on said first material layer; and removing a portion of said second photoresist mask according to a second pattern that is perpendicular to said first pattern.

* * * * *